(12) United States Patent
Heyl

(10) Patent No.: US 7,039,203 B2
(45) Date of Patent: *May 2, 2006

(54) REDUCED COMPLEXITY AUDIO MIXING APPARATUS

(75) Inventor: Lawrence F. Heyl, Mountain View, CA (US)

(73) Assignee: Apple Computer, Inc., Cupertino, CA (US)

( * ) Notice: Subject to any disclaimer, the term of this patent is extended or adjusted under 35 U.S.C. 154(b) by 810 days.

This patent is subject to a terminal disclaimer.

(21) Appl. No.: 10/039,614

(22) Filed: Dec. 31, 2001

(65) Prior Publication Data

US 2002/0057809 A1 May 16, 2002

Related U.S. Application Data

(60) Continuation of application No. 08/861,903, filed on May 21, 1997, which is a division of application No. 08/524,366, filed on Sep. 6, 1995, now abandoned.

(51) Int. Cl.
*H04B 1/00* (2006.01)

(52) U.S. Cl. ...................... 381/119; 381/104

(58) Field of Classification Search ............. 381/119, 381/28, 104–108, 21–24, 85, 80, 81, 1, 17, 381/18
See application file for complete search history.

(56) References Cited

U.S. PATENT DOCUMENTS

| | | | | |
|---|---|---|---|---|
| 3,845,392 A * | 10/1974 | Covill | ............... | 455/129 |
| 4,472,834 A * | 9/1984 | Yamamuro et al. | ............ | 381/61 |
| 4,524,452 A * | 6/1985 | Marshak | ............... | 381/119 |
| 5,511,423 A * | 4/1996 | Sugiyama | ............... | 73/602 |
| 5,633,938 A * | 5/1997 | Porter, III | ............... | 381/98 |
| 6,404,892 B1 * | 6/2002 | Heyl | ............... | 381/119 |

* cited by examiner

*Primary Examiner*—Huyen Le
*Assistant Examiner*—Justin Michalski
(74) *Attorney, Agent, or Firm*—Blakely, Sokoloff, Taylor & Zafman LLP

(57) ABSTRACT

A plurality of audio inputs which require gain applied are coupled together, the gain is applied and that weighted signal is summed with the output of similar circuits running with different gains. For typical overall gain requirements of 0 to +22.5 dB to be applied in 1.5 dB increments, the new circuit reduces by over two-thirds the number of analog switches required in the level adjusting portion of an audio mixer. More generally, the complexity of the new circuit, in terms of the number of analog switching elements is $2m(1+\log_2 n)$ for m channels with n gain steps/channel. The number of stages of differing gain is reduced from 2m variable gain amplifiers to $2(1+\log_2 n)$ fixed gain amplifiers.

14 Claims, 7 Drawing Sheets

REDUCED COMPLEXITY AUDIO MIXING APPARATUS

This application is a continuation of U.S. patent application Ser. No. 08/861,903, filed May 21, 1997, which is a divisional application of U.S. patent application Ser. No. 08/524,366, filed Sep. 6, 1995 now abandoned.

BACKGROUND OF THE INVENTION

1. Field of the Invention

The area of the present invention is that of audio mixers and, more particularly, the complexity required of a network to weight and add together multiple analog audio inputs.

2. Background Art

The evolution of computer technology has produced computer systems that are capable of simultaneously processing a variety of audio and video inputs. Such systems have become known in the art as "multimedia" computers. In a multimedia environment, audio signals from various input sources are typically summed and communicated to common output devices. These sources may include sound generated by the computer, internal CDROMs, external CDROMs, internal microphones, telecommunications DAAs, television audio, broadcast radio, and the like.

The prior art applied to this problem has been one of arranging a means to vary the level of each audio signal and then computing the algebraic sum of the various levels using analog circuitry well known in the art. This technique is straightforward and capable of excellent results. Typically, one level adjusting circuit is used for each input channel. A stereo input source (e.g., CDROM) will therefore require two channels.

While the prior art has used any number of methods to vary the level of an analog signal, Multimedia systems typically use some form of a multiplying D/A converter which allows discrete adjustment of the level, rather than the continuous adjustment of a volume control potentiometer. The discrete control uses a minimum gain variation chosen to be inaudible, usually agreed to be less than 1–2 dB.

In typical analog systems, each channel needing adjustment requires an operational amplifier "gain block", a resistor network to set the amount of gain, and an array of analog switches to select which tap of the resistor network will be used. A typical configuration will have the gain vary from 0 to +22.5 dB in +1.5 dB steps, requiring 16 analog switches. Given the ever increasing demands for integration of multimedia components, it is easy to justify mixing 6 stereo sources. Using the techniques of the prior art this will require 12 amplifiers, 192 resistors, and 192 analog switches just to implement the level adjusting portion of the circuit.

In general, personal computer functions supporting such multimedia audio capability will be supported within a single Application Specific Integrated Circuit (ASIC). In general, the level adjusting and mixing scheme needed in an audio ASIC is used to maximize the signal to quantization noise ratio in an A/D converter. Consequently, the level adjusting scheme must typically increase the signal amplitude and add the resulting amplified analog signals together. When attempting to apply the means of the prior art to an equivalent circuit in an ASIC, a large amount of expensive silicon die area is consumed. Accordingly, there exists a need for a reduced complexity audio mixing apparatus which provides a capability of mixing a number of input sources with a minimum number of analog components.

SUMMARY OF THE INVENTION

The present invention reduces the complexity of the implementation of an audio mixer, especially for those implementations within ASICs.

In the audio signal mixing apparatus of the present invention, a number of fixed gain amplifiers are used. All of the audio signal inputs which require a specified gain applied are coupled together and the resulting signal is applied to one the fixed gain amplifiers to produce an output signal. This output signal is summed with the output signals of similar circuits running with different gains. The overall output of these various fixed gain amplifier circuits is the mixed audio signal.

Because the audio mixing apparatus of the present invention relies on the use of fixed gain amplifiers, fewer switches and resistors than typically used in the variable gain amplifier networks of the prior art are required. Further, adapting the method of the present invention to digital mixers eliminates the need to perform complex multiply-adds. Instead, level adjusting can be performed using only simple add operations, well known in the signal processing art.

DETAILED DESCRIPTION OF THE INVENTION

Figure 1:
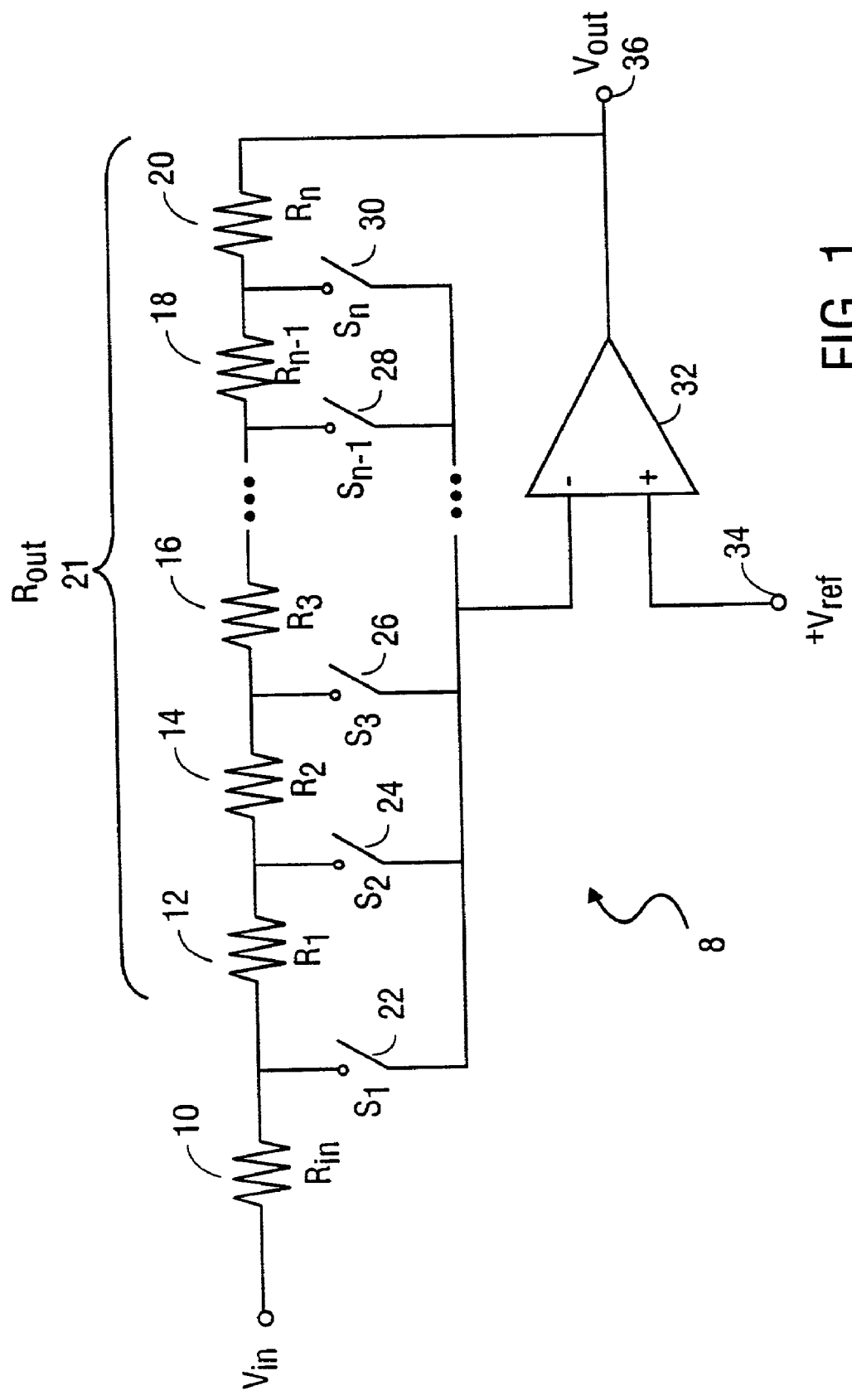
FIG. 1 is a circuit diagram of a typical variable gain amplifier level adjusting circuit used in the prior art.

Referring to the drawings in detail wherein like numerals designate like parts and components, the following description sets forth numerous specific details in order to provide a thorough understanding of the present invention. However, after reviewing this specification, it will be apparent to those skilled in the art that the present invention may be practiced without these specific details. In other instances, well known structures, techniques and devices have not been described in detail in order to not unnecessarily obscure the present invention.

Multimedia computers have the requirement for mixing audio from an increasing variety of sources. These sources include sound generated by the computer, internal CDROMs, external CDROMs, internal microphones, telecommunications DAAs, television audio, broadcast radio, and the like. Signals from each of these devices generally have varying levels, each of which needs to be adjusted before further processing can occur. Typically, the solution to this problem has been one of arranging a means to vary the level of each audio signal and then computing the algebraic sum of the various levels using analog circuitry well known in the art. Ordinarily, one level adjusting circuit is used for each input channel and, hence, stereo input sources (e.g., CDROMs) require two channels.

Figure 7:
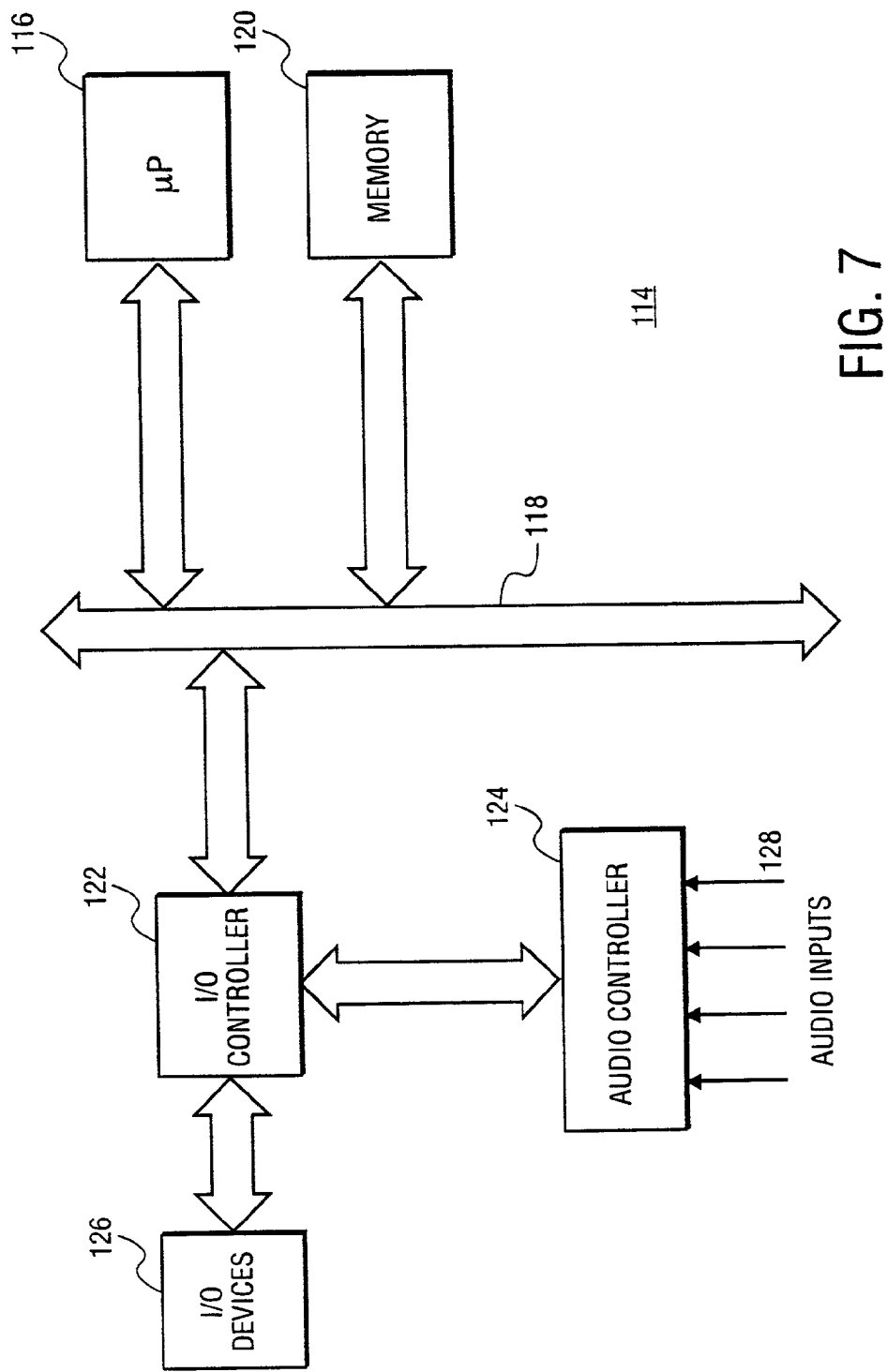
FIG. 7 is a schematic diagram of a typical computer system wherein the audio mixing apparatus of the present invention may be utilized.

FIG. 7 shows a typical computer system 114 wherein an audio controller is used. Microprocessor 116 communicates via system bus 118 with memory 120 and I/O controller 122. I/O Controller 122 is coupled to various I/O Devices 126 and to Audo Controller 124. Audio Controller 124 receives various audio inputs 128. As discussed above, these various audio inputs may be CDROMs, microphones, etc. In the prior art, Audio Controller 124 is an ASIC and typically includes one level adjusting circuit per channel. This arrangement is now replaced by the reduced complexity audio mixing apparatus of the present invention.

Referring to FIG. 1, a typical variable gain amplifier network 8 is depicted. Each input channel requires an operational amplifier "gain block" 32, a resistor network 21 to set the amount of gain, and an array of analog switches 22–30 to select which tap of the resistor network will be used. Input signal $V_{in}$ is presented to the variable gain amplifier network 8 through resistor $R_{in}$ 10. The gain provided by amplifier network 8 is given by $$V_{out}/V_{in} \approx -(R_{out}/R_{in}),$$

where $R_{out}$ represents the total resistance of the resistor network 21 formed by resistors $R_1, R_2, \ldots, R_n$ (12–20). The gain provided by the amplifier network 8 is thus proportional to the total resistance of resistor network 21. This resistance is made variable through the use of analog switches $S_1$–$S_n$ (22–30). By selecting which of switches 22–30 are closed, the effective resistance of resistor network 21 is determined and, hence, the gain of amplifier network 8 is set.

A typical configuration for amplifier network 8 will have the overall gain vary from 0 to +22.5 dB in +1.5 dB steps, requiring 16 analog switches, 16 resistors in resistor network 21 and one input resistor 10. For 6 stereo sources then, 12 amplifiers, 204 resistors, and 192 analog switches are required just to implement the level adjusting portion of the mixer. As indicated, such a circuit will consume a significant amount of silicon die area when implemented on an ASIC.

The present invention reduces the complexity of the level adjusting portion of an audio mixer by first recognizing that the gain applied to a given input signal does not need to change abruptly. That is, user needs or needs of automatic gain control loops will change at rates much less than the upper band edge of the envelope of the signal. Because of the logarithmic distribution of the gain control desired, it is possible to factor the sum of the input signals with the level adjusting weights applied to reduce the circuit complexity. This is accomplished by first connecting together all of the inputs that will need one of the gains applied. The gain is applied and that weighted signal summed with the output of similar circuits running with different gains. This development of the reduced complexity circuit is illustrated with reference to FIGS. 2–5.

Figure 2:
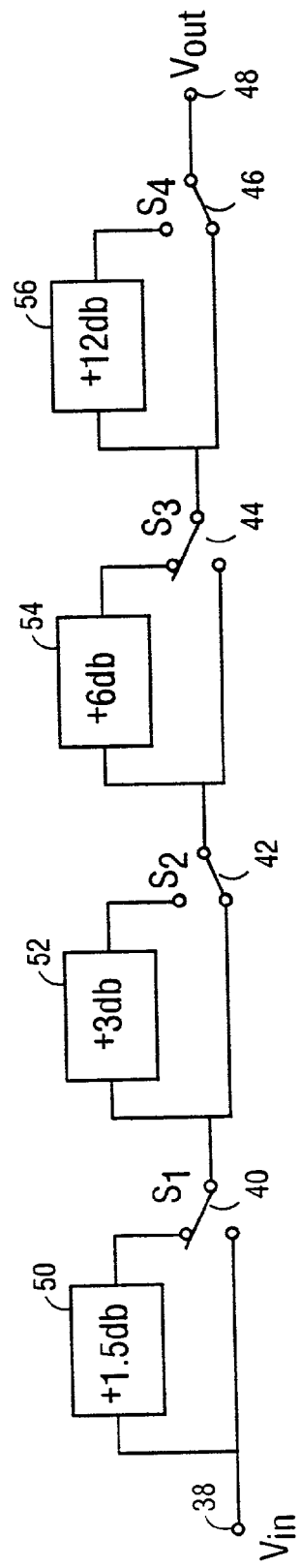
FIG. 2 is a block diagram of a cascaded variable gain level adjusting circuit using fixed gain amplifier blocks.

Referring now to FIG. 2, the variable gain requirements of the mixer as a whole are considered. If the gain blocks 50, 52, 54, 56 are cascaded, the requirement of having a step gain vary from 0 dB to +22.5 dB in 1.5 dB increments can be realized by switching the gain blocks in and out of the circuit path using switches 40, 42, 44 and 46. The overall gain of the circuit between nodes 38 and 46 is given by $$V_{out}/V_{in} = S_1(1.5\ dB) + S_2(3\ dB) + S_3(6\ dB) + S_4(12\ dB)$$

where the values of $S_1$, $S_2$, $S_3$ and $S_4$ are 0 for the case where the associated gain block is switched out of the circuit and 1 for the case where the associated gain block is switched in to the circuit. For the example shown in FIG. 2, the overall gain is 7.5 dB (i.e., $S_1$=1, $S_2$=0, $S_3$=1 and $S_4$=0). Thus, it is apparent that $0\ dB \leq V_{out}/V_{in} \leq +22.5\ dB$ is achieved by selecting which of switches 40, 42, 44 and 46 are closed.

Figure 3:
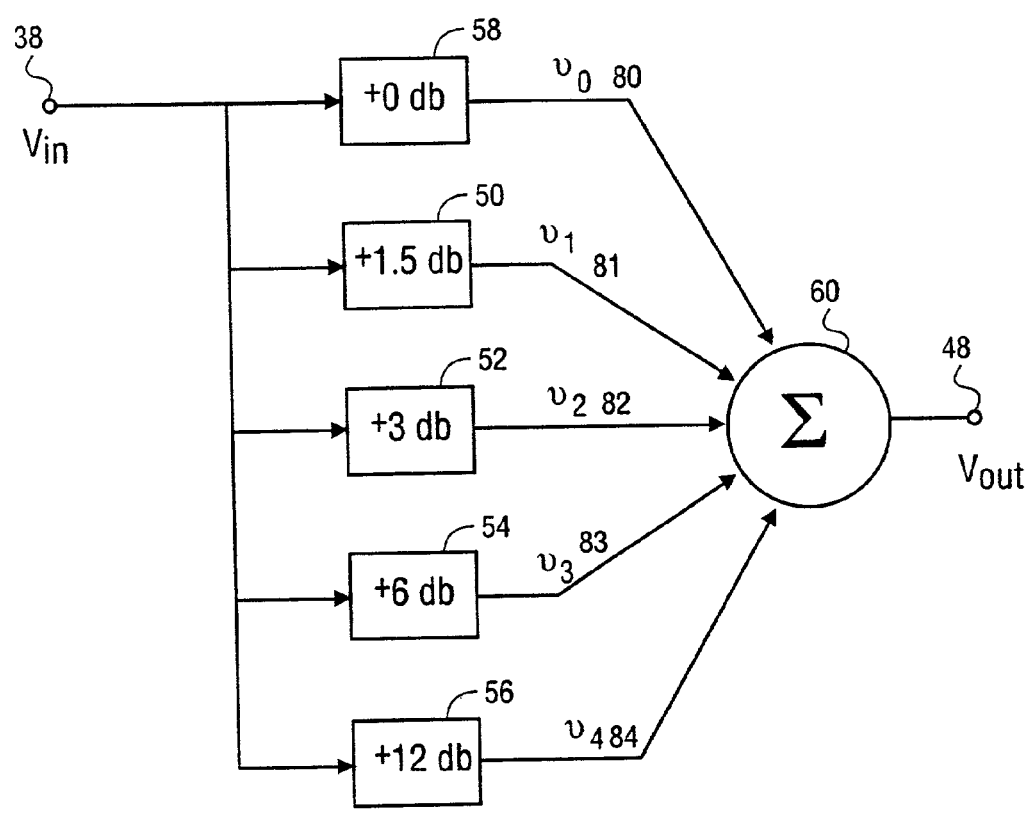
FIG. 3 is a block diagram of a variable gain level adjusting circuit wherein the outputs of the fixed gain blocks are summed together.

The same performance may be had using a summing arrangement rather than a cascade. FIG. 3 depicts such an arrangement wherein the input signal $V_{in}$ from node 38 is applied to each of gain blocks 50, 52, 54, 56 and 58. Numeral 58 indicates the special gain block adding 0 dB to the input signal. This gain block is associated with the case where all of the switches 40, 42, 44 and 46 in FIG. 2 are positioned such that none of the gain blocks are switched in to the circuit. In other words, $S_1$=$S_2$=$S_3$=$S_4$=0.

The summing device 60 in FIG. 3 is used to select which of the gain block output signals $V_0$, $V_1$, $V_2$, $V_3$ and $V_4$ (80, 81, 82, 83 and 84, respectively) will be coupled to output node 48. Summing device 60 is capable of coupling any combination of these signals so that the goal of varying the overall gain from 0 dB to +22.5 dB in 1.5 dB increments is maintained.

Figure 4:
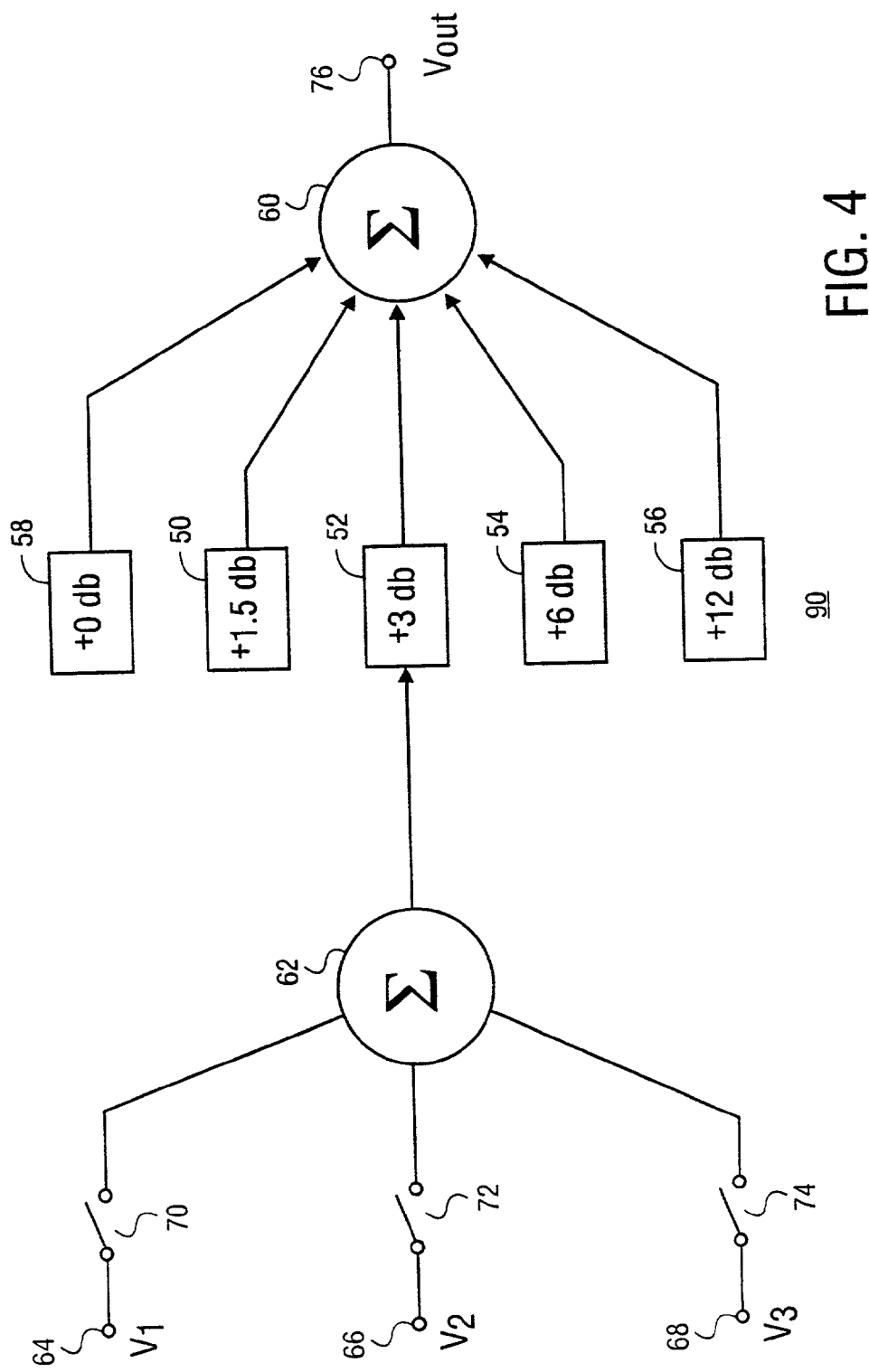
FIG. 4 is a block diagram of a variable gain level adjusting circuit wherein the outputs of the fixed gain blocks are summed together and wherein multiple inputs to a single gain block are summed together.

The network depicted in FIG. 3 is now modified for the case of multiple inputs requiring similar amplification. Referring to FIG. 4, the case of three inputs each requiring +3 dB gain is depicted. The individual input signals, $V_1$, $V_2$ and $V_3$, are presented at input nodes 64, 66 and 68, respectively. Switches 70, 72 and 74 determine which of these input signals are to be coupled to the gain block network 90. When switch 70 is closed, input node 64 is coupled to gain block 52 (+3 dB) through summing device 62. Similarly, when switches 72 and 74 are closed, input nodes 66 and 68, respectively, are coupled to gain block 52 through summing device 62. In one embodiment, summing device 62 is an op amp summing node (a device well known in the art), allowing each input signal to be coupled to gain block 52 when a respective switch is closed.

The output at node 76 for the example shown in FIG. 4 is $$V_{out} = (V_1 + V_2 + V_3)(+3\ dB),$$

assuming each of switches 70, 72 and 74 is closed.

Figure 5:
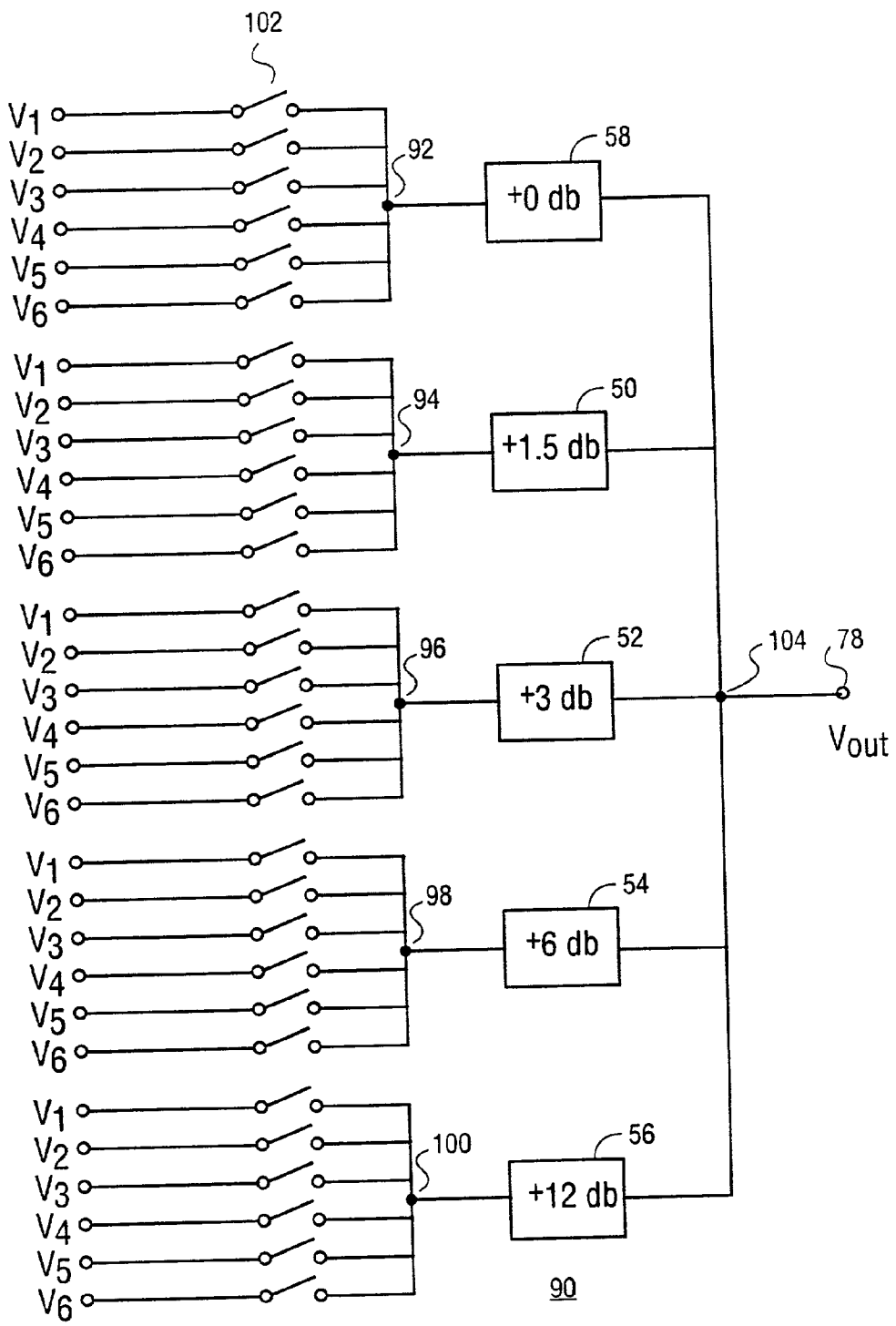
FIG. 5 is a block diagram showing one embodiment of the reduced complexity audio mixing apparatus of the present invention for the case of six input channels and gain blocks of 0, 1.5, 3, 6 and 12 dB.

FIG. 5 depicts a complete reduced complexity network according to the present invention. Gain blocks 50, 52, 54, 56 and 58 provide the required gain steps for the example of $0\ dB \leq V_{out}/V_{in} \leq +22.5\ dB$. Individual input signals $V_1$–$V_6$ are associated with various input devices. For example, $V_1$ and $V_2$ might represent the two input channels (Left and Right) for an internal CDROM in a multimedia computer. $V_3$ and $V_4$ might represent the two input channels for television audio. $V_5$ might represent the input channel for a microphone and $V_6$ might represent the input channel for a broadcast monaural radio signal. It will be appreciated that these examples are meant to be descriptive only and are not intended to limit the present invention.

Each of input signals $V_1$–$V_6$ are applied to each of gain blocks 50, 52, 54, 58 and 58 through summing nodes 92, 94, 96, 98 and 100, respectively. Although not depicted in FIG. 5 for the sake of clarity, each of summing nodes 92, 94, 96, 98 and 100 are similar to summing device 62 in FIG. 4. As indicated, in a preferred embodiment of the invention, these summing nodes are op amp summing nodes, well known in the art.

Each of input signal $V_1$–$V_6$ are applied to each of summing nodes 92-100 through a switch. For clarity, only switch 102 has been designated, however, it will be appreciated that each of the switches illustrated in FIG. 5 are identical. Switch 102 operates similarly to switches 22–30 in FIG. 1. By opening or closing the associated switch, e.g., switch 102, a given input signal can be coupled to a given gain block through an associated summing node. In practice, these switches can be user selected or software controlled to provide the required electrical path for each of inputs $V_1$–$V_6$.

As illustrated in FIG. 5, the present invention has reduced the complexity of the level adjusting portion of the mixer by connecting together all of the inputs that will need one of the gains applied. The gain is applied through one of gain blocks 52–58 and that weighted signal is summed with the output of similar circuits utilizing different gains at node 104. For the typical gain requirements noted above (i.e., 0–+22.5 dB), stages with 0, +1.5, +3, +6, and +12 dB are required. For the example cited (6 stereo channels with 16 steps/channel), the new circuit requires 5 (0, +1.5, +3, +6, +12 gain select)×2 (Left, Right)×6 (sources)=60 switches, 5 amplifiers, and a trifling number of resistors (on the order of 10) to set the gain of each of the 5 amplifiers. This represents slightly over a ⅔ decrease in analog switches alone, which will translate into reduced die area and reduced test time.

More generally, the complexity of the new circuit, using the novel approach depicted in FIG. 5, compared to the old circuit, using the approach depicted in FIG. 1, in terms of the reduction in the number of analog switching elements is $$\text{new/old} = 2m(1+\log_2 n)/2mn$$

for m channels with n gain steps/channel. The number of stages of differing gain is reduced from 2m variable gain amplifiers to $2(1+\log_2 n)$ fixed gain amplifiers. The "1" is needed for the special 0 dB case as discussed above.

Figure 6:
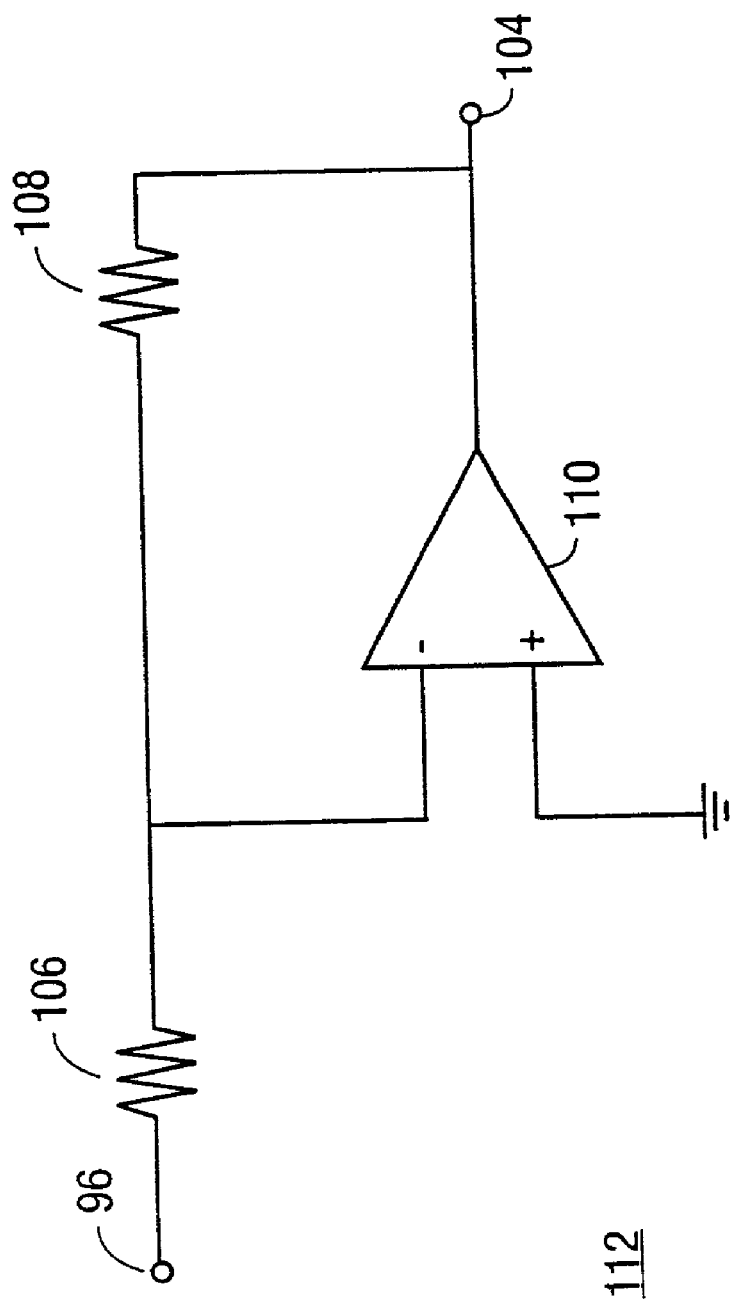
FIG. 6 is circuit diagram of a typical fixed gain amplifier used in the gain blocks of the present invention.

The use of fixed gain amplifiers (as represented in gain blocks 50–58) allows for the reduced number of resistors and the elimination of switches which were required in the case of the variable gain amplifiers. As shown in FIG. 6, each of gain blocks 50–58 can be implemented using a fixed gain amplifier consisting of a single op amp 110 and two resistors 106, 108. Resistors 106 and 108 are selected so as to provide the required gain, e.g., +3 dB for the case of gain block 52. The input to the fixed gain amplifier 112 is, for example, node 96. The output of the fixed gain amplifier is node 104.

It will be appreciated by those skilled in the art that two potential shortcomings of this approach relate to offset voltages and phase shifts in the different gain branches 50–58. Offset voltages can be a problem if the network is switched rapidly, but this will generally not be the case. The network will be switched in response to user requirements or in response to automatic gain control schemes which will typically have adaptation times in the 10–100 msec range. Offsets may be further reduced by addition of auto-zero circuitry well known in the art and well suited to integrated circuit construction, or they may be ameliorated by digital schemes using a table of calibration values which would be subtracted from digitally converted data. Phase shifts in the different gain channels can introduce a gain error, especially at higher frequencies (>2 kHz). This can be reduced using techniques well known in the art such as low value gain setting resistors and higher gain-bandwidth amplifier blocks.

An alternate implementation of the present invention uses digital techniques, and does not suffer from the possible DC offset and phase shift limitations of the analog embodiment discussed above. The digital implementation would be of considerable interest for digital audio mixing applications.

As an example, a codec requiring five stereo digital mixers independently capable of mixing ten stereo sources will require 200 multiplies using established signal processing techniques. Adapting the technique here disclosed would require an array of adders and gain scaling amplifiers. The {0, +1.5, +3, +6, +12} weight values may be easily realized by power of 2 shifts and adds, further simplifying the implementation. As a consequence, the digital mixer would then require 10×5×10+10×5=550 adds instead of 200 multiplies (and an additional 200 adds).

Thus, a reduced complexity audio mixing apparatus has been described.

Although the present invention has been described with specific reference to a number of details of the preferred embodiment and with reference to FIGS. 1 through 6, it will be apparent to those skilled in the art that a number of modifications and various variations may be employed without departure from the scope and spirit of the present invention.

I claim:

1. An apparatus for mixing a plurality of audio signals having different amplitude levels, wherein the apparatus comprises:
    means for adjusting the amplitude levels of said plurality of audio signals based on a plurality of distinct gain requirements of said plurality of audio signals, wherein said means for adjusting the amplitude levels comprises:
        means for forming a first set of audio signals of said plurality of audio signals based on a first gain requirement of said plurality of distinct gain requirements;
        means for forming a second set of audio signals of said plurality of audio signals based on a second gain requirement of said plurality of distinct gain requirements, said second set of audio signals being different than said first set of audio signals;
        means for applying a first gain to said first set of audio signals, said first gain determined by said first gain requirement; and
        means for applying a second gain to said second set of audio signals, said second gain determined by said second gain requirement;
        wherein said means for applying the first gain and said means for applying the second gain form a plurality of weighted signals;
    means for summing together said plurality of weighted signals.

2. The apparatus as described in claim 1, wherein said means for applying the first gain to said first set of audio signals comprises means for amplifying said first set of audio signals using a first fixed gain amplifier having a gain equal to said first gain requirement of said plurality of distinct gain requirements.

3. The apparatus as described in claim 2, wherein said means for applying the second gain to said second set of audio signals comprises means for amplifying said second set of audio signals using a second fixed gain amplifier having a gain equal to said second gain requirement of said plurality of distinct gain requirements.

4. The apparatus as described in claim 1, wherein said means for forming a first set of audio signals comprises means for summing said audio signals of the first set using a plurality of operational amplifiers.

5. The apparatus as described in claim 4, wherein said means for forming a second set of audio signals comprises means for summing said audio signals of the second set using a plurality of operational amplifiers.

6. An audio mixer comprising:
a plurality of summing nodes configured to form different sets of audio signals based on each individual gain requirement of each audio signal;
a plurality of gain amplifiers, each of said plurality of gain amplifiers being coupled to receive a signal from one of the plurality of summing nodes, and each of said plurality of gain amplifiers provides a distinct gain for each set of audio signals, wherein each distinct gain is equivalent to the individual gain requirement of each set of audio signals; and
an output summing node coupled to receive output signals of said gain amplifiers.

7. The audio mixer as described in claim 6, wherein the plurality of summing nodes comprises a plurality of operational amplifier nodes.

8. A computer system having:
a processor;
a bus coupled to said processor;
a memory coupled to said bus;
an audio mixer coupled to said bus and configured to adjust the amplitude levels of a plurality of audio signals having different amplitude levels, wherein said audio mixer comprises:
a plurality of summing nodes configured to form different sets of audio signals based on each individual gain requirement of each audio signal;
a plurality of gain amplifiers, each of said plurality of gain amplifiers being coupled to receive a signal from one of the plurality of summing nodes, and each of said plurality of gain amplifiers provides a distinct gain for each set of audio signals, wherein each distinct gain is equivalent to the individual gain requirement of each set of audio signals; and
an output summing node coupled to receive output signals of said gain amplifiers.

9. The computer system as described in claim 8, wherein the plurality of summing nodes comprises a plurality of operational amplifier nodes.

10. The computer system as described in claim 8, wherein said audio mixer digitally processes said different sets of audio signals.

11. A machine readable medium containing executable computer program instructions which when executed by a processing system cause said processing system to perform a method of mixing a plurality of audio signals having different amplitude levels, wherein the method comprises:
adjusting the amplitude levels of said plurality of audio signals based on a plurality of distinct gain requirements of said plurality of audio signals, wherein adjusting the amplitude levels comprises:
forming a first set of audio signals of said plurality of audio signals based on a first gain requirement of said plurality of distinct gain requirements;
forming a second set of audio signals of said plurality of audio signals based on a second gain requirement of said plurality of distinct gain requirements, said second set of audio signals being different than said first set of audio signals;
applying a first gain to said first set of audio signals, said first gain determined by said first gain requirement; and
applying a second gain to said second set of audio signals, said second gain determined by said second gain requirement;
wherein said applying the first gain and applying the second gain forms a plurality of weighted signals;
summing together said plurality of weighted signals.

12. The machine readable medium as described in claim 11, wherein said applying the first gain to said first set of audio signals comprises amplifying said first set of audio signals using a first fixed gain amplifier having a gain equal to said first gain requirement of said plurality of distinct gain requirements.

13. The machine readable medium as described in claim 12, wherein said applying the second gain to said second set of audio signals comprises amplifying said second set of audio signals using a second fixed gain amplifier having a gain equal to said second gain requirement of said plurality of distinct gain requirements.

14. The machine readable medium as described in claim 11, wherein forming a first set of audio signals comprises summing said audio signals of the first set using a plurality of operational amplifiers.

* * * * *